United States Patent [19]

Khadzhi et al.

[11] 4,021,294

[45] May 3, 1977

[54] PROCESS FOR PRODUCING AMETHYST CRYSTALS

[76] Inventors: Valentin Evstafievich Khadzhi, ulitsa Institutskaya, 14, kv. 8; Evgeny Matveevich Tsyganov, ulitsa Krasnoi Molodezhi, 4, kv. 56, both of Alexandrov Vladimirskoi oblasti; Leonid Iosifovich Tsinober, Novocheremushinskaya ulitsa, 55, korpus 1, kv. 10, Moscow; Zhanneta Viktorovna Novozhilova, ulitsa Krasnoi Molodezhi, 4, kv. 63, Alexandrov Vladimirskoi oblasti; Galina Vasilievna Reshetova, ulitsa Lenina, 24, kv. 6, Alexandrov Vladimirskoi oblasti; Mikhail Isaakovich Samoilovich, ulitsa Krasnoi Molodezhi, 4, kv. 64, Alexandrov Vladimirskoi oblasti; Vladimir Petrovich Butuzov, Sirenevy bulvar, 45, kv. 55; Anatoly Alexandrovich Shaposhnikov, 5 Vatutinsky pereulok, 31, kv. 10, both of Moscow; Margarita Vladimirovna Lelekova, ulitsa Krylovskaya, 6a, kv. 69, Pushkiho Moskovskoi oblasti, all of U.S.S.R.

[22] Filed: Apr. 21, 1976

[21] Appl. No.: 678,744

Related U.S. Application Data

[63] Continuation of Ser. No. 434,562, Jan. 18, 1974, abandoned.

[52] U.S. Cl. .................... 156/623 Q; 23/300; 23/301; 106/42; 252/62.9; 423/264; 423/339
[51] Int. Cl.² .................... B01J 17/04; C01B 33/12
[58] Field of Search ..... 156/623 Q; 23/300, 301 R; 106/42; 252/62.9; 423/264, 335, 339, 334

[56] References Cited

UNITED STATES PATENTS

| | | | |
|---|---|---|---|
| 3,356,463 | 12/1967 | Ballimbu | 156/623 Q |
| 3,832,146 | 8/1974 | Bresnahan | 156/623 Q |
| 3,936,276 | 2/1976 | Balitsky | 156/623 Q |

FOREIGN PATENTS OR APPLICATIONS 682,203  11/1952  United Kingdom .......... 156/623 Q

OTHER PUBLICATIONS

Tzinober et al., Synthetic Amethyst Quartz, Crystallography, vol. 4, No. 4, pp. 593–595, 1959.
White, The Synthesis and Uses of Artificial Gemstones, Endeavour, Apr. 1962, pp. 73–84.
Laudise et al., Pilot Plant Production, Synthetic Quartz, Chem. Eng. Prog., vol. 55, No. 5, May, 1959, pp. 55–59.
Brown et al., The Gr. prop. of Lg. Cryst. of Syn. Quartz, Mineralogical Magazine (London), vol. 29, No. 217, June 1952, pp. 858–874.
Brown et al., Resp. of Syn. Quartz to X-Ray Irrad., Nature, No. 4288, Jan. 5, 1952, pp. 35–36.

*Primary Examiner*—Stephen J. Emery

[57] ABSTRACT

A process for producing amethyst crystals involving growing of colorless quartz crystals by a hydrothermal method of a temperature drop in a high-pressure autoclave on crystalline quartz seed plates oriented parallel to the crystallographic planes of the major $\{10\bar{1}1\}$ and minor $\{1\bar{1}01\}$ rhombohedrons using crystalline quartz as a charge. Said growing is effected from aqueous solutions of potassium carbonate or potassium hydroxide having a concentration ranging from 4 to 7 wt.% and containing iron introduced into the autoclave in the form of metallic iron or in the form of its oxydic or hydroxydic compounds in an amount ranging from 5 to 30 g/l of the solution. The growing process is effected at a crystallization temperature within the range of from 300° to 500° C under a pressure ranging from 200 to 1,700 kg/cm² and a crystal growth rate of from 0.05 to 0.5 mm/day. It is advisable to introduce into the autoclave, prior to the crystal growing, lithium nitrite or lithium nitrate or manganese nitrate in an amount ranging from 1 to 10 g/l of the solution. The thus-grown colorless quartz crystals are exposed to an ionizing irridation. The process for growing crystals according to the present invention is well-reproducible, since it is performed at specfied physico-chemical parameters. The process of the present invention enables the production of amethyst crystals with a high color purity and a high transparency (i.e., with no cracks).

5 Claims, No Drawings

PROCESS FOR PRODUCING AMETHYST CRYSTALS

This is a coutinuation of application Ser. No. 434,562 filed Jan. 18, 1974 now abandoned.

The present invention relates to processes for the production of amethyst crystals, i.e. violet-coloured quartz crystals. Said crystals are used as semi-precious stones in the jeweller's art.

Known in the art is a process for producing amethyst crystals by way of growing colourless quartz crystals by a hydrothermal method of a temperature drop in a high-pressure autoclave on crystalline quartz seed plates oriented parallel to the crystallographic planes of the major $\{10\bar{1}1\}$ and minor $\{1\bar{1}01\}$ rhombohedrons from aqueous solutions of potassium carbonate or potassium hydroxide containing iron introduced into the autoclave in the form of oxydic or hydroxydic compounds or in the form of metallic iron using a charge, viz. crystalline quartz, followed by exposing the thus-grown colourless quartz crystals to an ionizing irradiation [(cf. the article by L. I. Tzinober and L. G. Chentzova in the "Kristallographija" (Crystallography) journal, 4, 633, 1959)].

Investigations of amethyst crystals performed by methods of optical spectroscopy, electrone paramagnetic resonance, spectral chemical analysis and neutronactivation analysis have shown that the violet colour of quartz is attributed to electrone-hole centers resulting from the action of an ionizing irradiation upon a colourless quartz crystal containing structural (isomorphic) doping ions of trivalent iron $Fe^{3+}$ entrained by the crystal during its growth. Said electrone-hole centers are localized in the crystals on the above-mentioned doping ions of trivalent iron. Therefore, the presence of trivalent doping iron in the solution from which colourless quartz crystals are grown is an obligatory condition of the formation of amethyst crystals.

This prior-art process of producing amethyst crystals has the following disadvantages:

1. Rather bad reproducibility of the process of growing colourless quartz crystals due to unspecified physico-chemical parameters of the process (concentrations of the solutions employed, amounts of metallic iron or its compounds introduced into the autoclave, crystallization temperatures, pressure inside the autoclave, crystal growth rates on seed plates of the above-mentioned crystallographic orientations).

2. Insufficient purity of violet (amethyst) colour of the crystals obtained mainly due to a relatively high content of the aluminium impurity in aqueous solutions of potassium carbonate or potassium hydroxide. The main source of aluminium is represented by inclusions of various aluminium-containing minerals in naturally-occurring crystalline quartz used as a charge. As is well known, aluminium impurity entrained during the growing process by colourless quartz crystals under the action of an ionizing irradiation forms centers of a smoky colour substantially impairing the purity of the amethyst crystal colour.

Furthermore, a low oxidation potential of said solutions is responsible for the presence of bi- and tri-valent iron in these solutions. A growing colourless quartz crystal entrains iron from the solutions not only in its "useful" trivalent state but also in a "harmful" bivalent state. The latter phenomenon exerts a detrimental effect on a colour purity of amethyst crystals.

3. Substantial fracturing of the crystals being produced, especially in the case of crystal growing on crystalline quartz seed plates oriented parallel to the crystallographic planes of the major rhombohedron.

It is an object of the present invention to provide such a process for producing amethyst crystals, wherein the growing of colourless quartz crystals would be effected under specified physico-chemical parameters of the process which would enable a good reproducibility of said process.

Another object of the present invention is to provide such a process which would make it possible to produce amethyst crystals with a high purity of colour.

Still another object of the present invention is to provide such a process which would make it possible to produce amethyst crystals with a high transparency (i.e. with no cracks).

These and other objects of the present invention are accomplished by that the growing of colourless quartz crystals is effected by a hydrothermal method of a temperature drop in a high-pressure autoclave on crystalline quartz seed plates oriented parallel to the crystallographic planes of the major $\{10\bar{1}1\}$ or minor $\{1\bar{1}01\}$ rhombohedrons using crystalline quartz as a charge; said growing is effected from aqueous solutions of potassium carbonate or potassium hydroxide having a concentration ranging from 4 to 7% by weight and containing iron introduced into the autoclave in the form of metallic iron or in the form of its oxydic or hydroxydic compounds in an amount ranging from 5 to 30 g/l of the solution; said growing of colourless quartz crystals is conducted at a crystallization temperature within the range of from 300° to 500° C under a pressure of from 200 to 1,700 kg/cm² and at a crystal growth rate of from 0.05 to 0.5 mm/day; the thus-grown colourless quartz crystals are exposed to an ionizing irradiation.

Said conditions of crystal growing make it possible to grow colourless quartz crystals and, hence, amethyst crystals of a sufficiently high quality. The growing process per se is well-reproducible due to specified physico-chemical parameters thereof.

To produce amethyst crystals with a uniform distribution of violet colour over the entire volume of the crystals as well as with a high transparency (i.e. with the minimal presence of cracks), it is advisable to employ aqueous solutions of potassium carbonate or potassium hydroxide having a 5 wt.% concentration; the growing of colourless quartz crystals should be performed at the crystallization temperature of 360° C under the pressure of 1,500 kg/cm² and at a crystal growth rate of from 0.1 to 0.2 mm/day on seed plates oriented parallel to the crystallographic planes of the major rhombohedron and from 0.2 to 0.4 mm/day on seed plates oriented parallel to the crystallographic planes of the minor rhombohedron.

The use, in the process of the present invention, of seed-plates oriented parallel to crystallographic planes of the minor rhombohedron ensures the following advantages of the process of growing colourless quartz crystals in comparison with the same process but performed using seed plates oriented parallel to the crystallographic planes of the major rhombohedron.

First, the crystal growth rate along the faces of the minor rhombohedron is approximately by 2–3 times as high, wherefore the process productivity is increased and the cost of colourless quartz, and hence amethyst, crystals is reduced.

Secondly, the crystals grown along the faces of the minor rhombohedron contain hardly any cracks, whereas the crystals grown along the faces of the major rhombohedron are subjected to an intensive fracturing.

It should be also noted that from colourless quartz crystals grown on quartz seed plates oriented parallel to the crystallographic planes of the minor rhombohedron there are obtained (after the exposure of said quartz crystals to an ionizing irradiation) amethyst crystals revealing the effect of colour pleochroism. The latter comprises colour variation from pale-lilac to reddish-violet upon changing the crystal orientation with respect of the light ray. The property of colour pleochroism inherent in some varieties of naturally-occurring amethyst enhances the jewelry value of the crastals being produced.

To produce amethyst crystals with a greater purity of the violet colour, it is advisable to employ, as a charge for growing colourless quartz crystals, crystalline quartz containing aluminium impurity in an amount of at most $5.10^{-3}$ wt.%.

As such quartz use may be made either of naturally-occurring quartz with said limitation as to the aluminium content, or of specially grown crystals of synthetic quartz, the process of producing the same ensuring the aluminium impurity content therein of at most $5.10^{-3}$ wt.%. The process for producing synthetic quartz crystals according to the present invention comprises growing the crystal by a hydrothermal method of a temperature drop in a high-pressure autoclave on crystalline quartz seed plates oriented parallel to the crystallographic pinacoid planes $\{0001\}$ from aqueous solutions of sodium carbonate or sodium hydroxide with a concentration ranging from 3 to 7 wt.% using crystalline quartz as a charge, at a crystallization temperature within the range of from 335° to 345° C under a pressure of from 700 to 1,500 kg/cm² and at a crystal growth rate of from 0.15 to 0.5 mm/day.

To eliminate strains from the surface of seed plates and, hence, to avoid fracturing of amethyst crystals, it is advisable, prior to the growing colourless quartz crystals, to etch crystalline quartz seed plates with a 40% hydrofluoric acid at a temperature of from 18° to 22° C for a period of 2 to 3 hours.

To enhance the colour purity of amethyst crystals and to produce said crystals with the properties identical to those of the best naturally-occurring specimens, it is recommended to introduce lithium nitrite or lithium nitrate or manganese nitrate into the autoclave in an amount ranging from 1 to 10g/l of the potassium carbonate or potassium hydroxide solution prior to the growing said colourless quartz crystals.

It is known that iron when introduced into an aqueous solution of potassium carbonate or potassium hydroxide in metallic form or in the form of its oxydic or hydroxydic compounds, under the conditions of crystal growing process is present both in bivalent and trivalent state. The addition of strong oxidizing agents such as lithium nitrite or nitrate or manganese nitrate results in that the iron is transformed mainly to trivalent state from its bivalent condition. The predominance of trivalent iron in the solution of potassium carbonate or potassium hydroxide facilitates the production of amethyst crystals with a high colour purity. Lithium ions, moreover, exert a so-called "purifying action" in the solution of potassium carbonate or potassium hydroxide thus freeing it from undesirable aluminium impurity by combining it into sparingly soluble silicates of the eucryptite type ($LiAlSiO_4$), whereby the colour purity of the amethyst crystals is further enhanced.

The process for producing amethyst crystals according to the present invention is embodied in the following manner.

Into a lower portion (dissolution chamber) of a high-pressure autoclave a crystalline quartz charge is placed. As the charge use may be made of naturally-occurring crystalline quartz such as monomineral vein quartz or crystals of synthetic quartz which are especially advisable to employ for the production of amethyst crystals with a high colour purity. After placing the charge into the autoclave, a perforated transverse partition is installed to separate the dissolution chamber from the top portion of the autoclave, i.e. growth chamber. Then, crystalline quartz seed plates oriented parallel to the crystallographic planes of the major $\{10\bar{1}1\}$ or minor $\{1\bar{1}01\}$ rhombohedrons are inserted into the growth chamber. In doing so, it is possible to insert, into the growth chamber, either seed plates oriented parallel to the crystallographic planes of the major rhombohedron or seed plates oriented parallel to the crystallographic planes of the minor rhombohedron or seed plates of both orientations.

After placing the charge and seed plates, the autoclave is charged with an aqueous solution of potassium carbonate or potassium hydroxide (process solution). In addition, introduced into the autoclave are additives of metallic iron or its oxydic ($FeO$, $Fe_2O_3$, $Fe_3O_4$ or hydroxydic ($Fe(OH)_2$, $Fe(OH)_3$) compounds and, when necessary, additives of lithium nitrite or nitrate or manganese nitrate. Said additives are introduced either into the dissolution chamber during the charging, or into the growth chamber after adding the process solution into the autoclave.

After charging, the autoclave is hermetically sealed and brought to predetermined growing conditions (the term "growing conditions as used in the present description means crystallization temperature, pressure in the autoclave, and the quartz crystal growth rate). The predetermined growing conditions are maintained within the autocalve during the entire cycle. The cycle duration (days) is calculated according to the formula $\tau = d/v$ where $d$ (mm) is a predetermined thickness of the crystalline quartz layer being grown on a seed plate; $v$ (mm/day) is a predetermined growth rate of the quartz layer being grown on a seed plate of a given orientation. On completion of the growing cycle the autoclave heating is disconnected; the autoclave is cooled to room temperature and the resulting colourless quartz crystals are discharged therefrom.

The colourless quartz crystals are exposed to an ionizing irradiation (Y-rays, hard X-rays, accelerated electrons) with a dose ranging from $1.10^3$ to $1.10^7$ and preferably from $5.10^5$ to $1.10^6$ r, whereby the above-mentioned crystals become violet (amethyst) coloured.

For better understanding of the present invention the following Examples illustrating the production of amethyst crystals are given hereinbelow.

EXAMPLE 1

Into a high-pressure autoclave a charge, viz. naturally-occurring quartz, crystalline quartz seed plates oriented parallel to the crystallographic planes of the major $\{10\bar{1}1\}$ and minor $\{1\bar{1}01\}$ rhombohedrons were introduced, whereafter a 4% aqueous solution of potassium hydroxide and ferric hydroxide $Fe(OH)_3$ in the amount of 5 g/l of the solution were added thereto. The growing of colourless quartz crystals was effected at the crystallization temperature of 500° C under the pressure of 1,700 kg/cm² and at crystal growth rates of 0.2 and 0.5 mm/day along the faces of the major and minor rhombohedrons respectively. The quartz crystals grown on seed plates oriented parallel to the crystallographic planes of the major rhombohedron had cracks, the mean density of which was 1 crack per 0.8 cm² of the crystal surface. The quartz crystals grown on seed plates oriented parallel to the crystallographic planes of the minor rhombohedron had no cracks whatsoever. The colourless quartz crystals were exposed to $\gamma$-irradiation using $Co^{60}$ as the radiation source with the dose of $1.10^6$ r. As a result, the quartz crystals became violet coloured with a slight smoky tint.

EXAMPLE 2

Into a high-pressure autoclave there were placed a charge, viz. naturally-occurring crystalline quartz, crystalline quartz seed plates oriented parallel to the crystallographic planes of the major $\{10\overline{1}1\}$ and minor $\{1\overline{1}01\}$ rhombohedrons an aqueous solution of potassium carbonate with the concentration of 7 wt.%, and ferrous hydroxide $Fe(OH)_2$ in the amount of 10 g/l of the solution. The growing of colourless quartz crystals was effected at the crystallization temperature of 300° C under the pressure of 200 kg/cm² and the crystal growth rates of 0.05 and 0.15 mm/day along the faces of the major and minor rhombohedrons respectively. The resulting quartz crystals, especially those grown along the faces of the major rhombohedron contained several cracks. After the exposure to $\gamma$-irradiation with the dose of $1.10^6$ r, the colourless quartz crystals became violet coloured with a smoky tint.

EXAMPLE 3

Into a high-pressure autoclave there were placed a charge viz. naturally-occurring crystalline quartz, crystalline quartz seed plates oriented parallel to the crystallographic planes of the major and minor rhombohedrons, an aqueous solution of potassium carbonate with the concentration of 5% by weight and ferrous oxide FeO in the amount of 10 g/l of the solution. The growing of colourless quartz crystals was effected at the crystallization temperature of 360° C under the pressure of 1,500 kg/cm² and growth rates of 0.15 and 0.3 mm/day along the faces of the major and minor rhombohedrons respectively. The resulting quartz crystals, especially those grown along the faces of the major rhombohedron, contained few cracks. After the exposure to $\gamma$-irradiation with the dose of $1.10^6$ r, the colourless quartz crystals became violet coloured with a slight smoky tint.

EXAMPLE 4

The autoclave was charged in a manner similar to that of Example 3, but instead of general naturally-occurring crystalline quartz as the charge use was made of naturally-occurring crystalline quartz containing aluminium impurity in the amount of $2.10^{-3}$ wt.%, while iron dopant was introduced into the autoclave in the form of metallic iron in the amount of 15 g/l of the solution. The growing conditions for producing colourless quartz crystals were similar to those of Example 3. the thus-grown quartz crystals contained individual cracks. After the exposure to $\gamma$-irradiation with the dose of $1.10^6$ r, crystals became violet coloured with a high colour purity and medium intensity.

EXAMPLE 5

The charging of the autocalve was effected in much the same manner as in Example 3, except that instead of ferrous oxide FeO use was made of ferrix oxide $Fe_2O_3$ in the amount of 20 g/l of the solution and lithium nitrate $LiNO_3$ was introduced into the autoclave in the amount of 7 g/l of the potassium carbonate solution. The seed plates oriented parallel to the crystallographic planes of the major and minor rhombohedrons, prior to placing into the autoclave, were subjected to etching with a 40% hydrofluoric acid for 2.5 hours at the temperature of 20° C. The growing of colourless quartz crystals was effected under the growing conditions similar to those described in Example 3. The thus-grown crystals were transparent and contained no cracks. After the exposure to $\gamma$-irradiation with the dose of $1.10^6$ r, the crystals became coloured into dark-violet colour of a high purity. The crystals grown along the faces of the minor rhombohedron after the irradiation revealed distinctly pronounced colour pleochroism.

EXAMPLE 6

Into a high-pressure autoclave there were placed a charge, viz. naturally-occurring cyrstalline quartz, crystalline quartz seed plates oriented parallel to the crystallographic planes of the minor $\{1\overline{1}01\}$ rhombohedron, an aqueous solution of potassium carbonate with the concentration of 5 wt. %, ferric-ferrous oxide $Fe_3O_4$ in the amount of 30 g/l of the solution and lithium nitrate $LiNO_3$ in the amount of 5 g/l of the solution. The growing of colourless quartz crystals was effected under conditions similar to those of Example 3. The resulting grown crystals were transparent and contained no cracks. After the exposure to $\gamma$-irradiation with the dose of $1.10^6$ r, the quartz crystals became violet-coloured with the uniform colour distribution over the crystal volume and characteristic colour pleochroism effect.

EXAMPLE 7

Into a high-pressure autoclave there were placed a charge viz. naturally-occurring crystalline quartz containing aluminium impurity in the amount of $5.10^{-3}$ wt.%, quartz crystalline plates oriented parallel to the crystallographic planes of the major and minor rhombohedrons, an aqueous solution of potassium carbonate with the concentration of 5 wt.%, ferric oxide $Fe_2O_3$ in the amount of 20 g/l of the solution and lithium nitrite $LiNO_2$ in the amount of 1 g/l of the solution. The seed plates, prior to placing into the autoclave, were subjected to etching with a 40% hydrofluoric acid for 2.5 hours at 20° C. The growing of colourless quartz crystals was effected at the crystallization temperature of 360° C under the pressure of 1,500 kg/cm² at the crystal growth rates of 0.2 and 0.4 mm/day along the faces of the major and minor rhombohedrons respectively. The resulting crystals were transparent and contained no cracks. After the exposure to X-rays with the dose of $5.10^5$ r, the crystal of quartz became violet coloured with a high colour purity. The crystals grown along the faces of the minor rhombohedron revealed, after the irradiation, a distinctly pronounced colour pleochroism effect.

EXAMPLE 8

A charge was preliminary prepared comprising synthetic quartz crystals with the aluminium impurity content of $1 \cdot 10^{-3}$ wt.%. To this end, the starting charge, viz. naturally-occurring crystalline quartz, quartz crystalline seed plates oriented parallel to the pinacoid crystallographic planes {0001} and an aqueous solution of sodium hydroxide with the concentration of 3 wt.% are placed into the autoclave. The growing of synthetic quartz crystals with the above-mentioned aluminium content was effected at the crystallization temperature of 345° C under the pressure of 1,500 kg/cm$^2$ and at the crystal growth rate of 0.5 mm/day.

Then, another autoclave operating under a high pressure was charged with the charge prepared in the above-described manner (synthetic quartz crystals), crystalline quartz seed plates oriented parallel to the crystallographic planes of the major and minor ({10$\bar{1}$1} and {1$\bar{1}$01} respectively) rhombohedrons, an aqueous solution of potassium carbonate with the concentration of 5 wt.%, ferric oxide Fe$_2$O$_3$ in the amount of 15 g/l of the solution, and lithium nitrate LiNO$_3$ in the amount of 5 g/l of the solution. The seed plates, prior to placing into the autoclave, were subjected to etching with a 40% hydrofluoric acid at 22° C for 2 hours. The growing of colourless quartz crystals was effected at the crystallization temperature of 350° C, under the pressure of 1,300 kg/cm$^2$ and the crystal growth rates of 0.1 and 0.2 mm/day respectively along the faces of the major and minor rhombohedrons. The thus-grown crystals were transparent and contained no cracks. After the exposure to γ-irradiation with the dose of $1 \cdot 10^6$ r, the crystals of quartz became violet coloured with a high colour purity. The crystals grown on the seed plates oriented parallel to the crystallographic planes of the minor rhombohedron revealed, after the irradiation, a distinctly pronounced colour pleochroism effect.

EXAMPLE 9

A charge was preliminary prepared comprising synthetic quartz crystals containing aluminium impurity in the amount of $8 \cdot 10^{-4}$ wt.%. To this end, into a high-pressure autoclave there were charged a charge, viz. naturally-occurring crystalline quartz, crystalline quartz seed plates oriented parallel to the crystallographic planes of pinacoid {0001} and an aqueous solution of sodium carbonate with the concentration of 7 wt.%.

The growing of synthetic quartz crystals with the above-given aluminium content was effected at the crystallization temperature of 335° C, under the pressure of 700 kg/cm$^2$ and the crystal growth rate of 0.15 mm/day.

Then, into another high-pressure autoclave there were placed the charge prepared by the above-described method (synthetic quartz crystals), quartz crystalline seed plates oriented parallel to the crystallographic planes of the major {10$\bar{1}$1} and minor {1$\bar{1}$01} rhombohedrons, an aqueous solution of potassium carbonate with the concentration of 5 wt.%, metallic iron in the amount of 20 g/l of the solution and manganese nitrate Mn(NO$_3$)$_2$ in the amount of 10 g/l of the solution. The seed plates, prior to placing into the autoclave, were subjected to etching with a 40% hydrofluoric acid at 18° C for 3 hours. The growing of colourless quartz crystals was effected at the crystallization temperature of 360° C under the pressure of 1,500 kg/cm$^2$ and the crystal growth rates of 0.15 and 0.3 mm/day along the faces of the major and minor rhombohedrons respectively. The thus-grown crystals were transparent and contained no cracks. After the exposure to γ-irradiation with the dose of $1 \cdot 10^6$ r, the quartz crystals became violet coloured with a high colour purity. The crystals grown on the seed plates oriented parallel to the crystallographic planes of the minor rhombohedron revealed, after the irradiation, a distinctly pronounced colour pleochroism effect.

What is claimed is:

1. A process for producing clear, unsmoky amethyst crystals which comprises (a) growing colorless quartz crystals by a hydrothermal method of a temperature drop on crystalline quartz seed plates oriented parallel to the crystallographic planes of the major {10$\bar{1}$1} and minor {1$\bar{1}$01} rhombohedrons using crystalline quartz having an aluminum impurity content of at most $5 \cdot 10^{-3}$ weight percent as a charge; said growing being effected from aqueous solution of potassium carbonate or potassium hydroxide, the solution having a concentration ranging from 4 to 7 weight percent and containing iron in the form of a substance selected from the group consisting of metallic iron, and its oxide and hydroxide compounds, in an amount ranging from 5 to 30 g/l of the solution and an oxidizing agent selected from the group consisting of lithium nitrate, lithium nitrite and manganese nitrate in an amount ranging from 1 to 10 g/ml of the solution of potassium compounds; said growing of colorless quartz crystals being effected at a crystallization temperature within the range of from 300° to 500° C under a pressure of from 200 to 1,700 kg/cm$^2$ and a crystal growth rate of from 0.05 to 0.5 mm/day; and (b) exposing the thus-grown colorless quartz crystals to an ionizing irradiation.

2. A process as claimed in claim 1, wherein said colorless quartz crystals are grown on seed plates oriented parallel to the crystallographic planes of the major rhombohedron, said aqueous solutions of potassium compounds have a concentration of 5 weight precent, and the crystal growing is effected at a crystallization temperature at 360° C under a pressure of 1,500 kg/cm$^2$ and at a crystal growth rate of from 0.1 to 0.2 mm/day.

3. A process as claimed in claim 1, wherein said colorless quartz crystals are grown on seed plates oriented parallel to the crystallographic planes of the minor rhombohedron, said aqueous solutions of potassium compounds having a concentration of 5 weight percent and the crystal growing is effected at a crystallization temperature of 360° C under a pressure of 1500 kg/cm$^2$ and a crystal growth rate of from 0.2 to 0.4 mm/day.

4. A process as claimed in claim 1, wherein said crystalline quartz having an aluminum impurity content of at most $5 \cdot 10^{-3}$ weight percent is synthetic quartz crystals which are grown by a hydrothermal method of a temperature drop on crystalline quartz seed plates oriented parallel to the crystallographic planes of pinacoid {0001} using crystalline quartz as a charge; said growing being effected from aqueous solutions of sodium compounds selected from the group consisting of sodium carbonate and sodium hydroxide, said solutions having a concentration within the range of from 3 to 7 weight percent; said growing is effected at a crystallization temperature within the range of from 335° to 345° C under a pressure of from 700 to 1,500 kg/cm$^2$ and a crystal growth rate of from 0.15 to 0.5 mm/day.

5. A process as claimed in claim 1, wherein the crystalline quartz seed plates are etched, prior to growing colorless quartz crystals, with a 40% hydrofluoric acid at a temperature within the range of from 18 to 22° C for a period of from 2 to 3 hours.

* * * * *